United States Patent
Mazure et al.

(10) Patent No.: US 8,305,803 B2
(45) Date of Patent: Nov. 6, 2012

(54) DRAM MEMORY CELL HAVING A VERTICAL BIPOLAR INJECTOR

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 100 days.

(21) Appl. No.: 12/942,754

(22) Filed: Nov. 9, 2010

(65) Prior Publication Data
US 2011/0170343 A1 Jul. 14, 2011

(30) Foreign Application Priority Data
Jan. 14, 2010 (FR) .................................... 10 50241

(51) Int. Cl.
G11C 11/40 (2006.01)
G11C 11/402 (2006.01)

(52) U.S. Cl. ........ 365/177; 365/174; 365/184; 257/273; 257/347; 257/408

(58) Field of Classification Search ................. 365/174, 365/177, 184; 257/273, 347, 408
See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,841,175 A | 11/1998 | Sugiura et al. | 257/392 |
| 5,844,845 A | 12/1998 | Tahara | 365/189.05 |
| 5,869,872 A | 2/1999 | Asai et al. | 257/360 |
| 5,889,293 A | 3/1999 | Rutten et al. | 257/74 |
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |

(Continued)

FOREIGN PATENT DOCUMENTS

EP   1 081 748 A2   3/2001

(Continued)

OTHER PUBLICATIONS

U.S. Appl. No. 12/793,553, filed Jun. 3, 2010.

(Continued)

*Primary Examiner* — Hoai V Ho
*Assistant Examiner* — Jay Radke
(74) *Attorney, Agent, or Firm* — Winston & Strawn LLP

(57) ABSTRACT

The invention relates to a memory cell having an FET transistor with a source, a drain and a floating body between the source and the drain, and an injector that can be controlled to inject a charge into the floating body of the FET transistor. The injector includes a bipolar transistor having an emitter, a base and a collector formed by the body of the FET transistor. Specifically, in the memory cell, the emitter of the bipolar transistor is arranged so that the source of the FET transistor serves as the base for the bipolar transistor. The invention also includes a memory array comprising a plurality of memory cells according to the first aspect of the invention, and to methods of controlling such memory cells.

20 Claims, 8 Drawing Sheets

U.S. PATENT DOCUMENTS

| | | | |
|---|---|---|---|
| 6,215,138 B1 | 4/2001 | Takao | 257/288 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 7,489,008 B1* | 2/2009 | Lee et al. | 257/347 |
| 7,643,346 B2 | 1/2010 | Toriyama et al. | 365/185.17 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0167751 A1 | 8/2005 | Nakajima et al. | 257/347 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0013030 A1* | 1/2007 | Ranica et al. | 257/544 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1* | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0189094 A1* | 8/2007 | Ohsawa | 365/210 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096036 A1 | 4/2009 | Ishigaki et al. | 257/392 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0140288 A1* | 6/2009 | Lee et al. | 257/133 |
| 2009/0256204 A1* | 10/2009 | Cai et al. | 257/350 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 095 407 A1 | 5/2001 |
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 | 5/1998 |
| JP | 2000196089 A | 7/2000 |
| JP | 2004303499 | 10/2004 |
| JP | 2005217379 | 8/2005 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,515, filed Jun. 3, 2010.
U.S. Appl. No. 12,789,100, filed May 27, 2010.
U.S. Appl. No. 12/886,421, filed Sep. 20, 2010.
U.S. Appl. No. 12/961,293, filed Dec. 6, 2010.
U.S. Appl. No. 12/984,466, filed Dec. 6, 2010.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. Of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
K. Itoh, et al., "Impact of FD-SOI on Deep-Sub-100-nm CMOS LSIs—A View of Memory Designers" Central Research Laboratory, Tokyo, Japan, 2 pages.
M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).
M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).
S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).
S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al."An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al."SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, ( 2007).

K. Roy, et al. "Double-Gate SOI Devices for Low-Power and High-Performance Applications," IEEE Computer Society, The British Library, IEEE Xplore, 8 pages, (2006).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

European Search Report Application No. EP 10 29 0217 dated Sep. 15, 2010.

U.S. Appl. No. 12/007,483, filed Jan. 14, 2011.

European Search Report Application No. EP 10290181.6 dated Jan. 14, 2011.

U.S. Appl. No. 13/007,483, filed Jan. 14, 2011.

U.S. Appl. No. 13/013,580, filed Jan. 25, 2011.

U.S. Appl. No. 12/880,806, filed Sep. 13, 2010.

U.S. Appl. No. 12/898,230, filed Oct. 5, 2010.

U.S. Application No. 12/946,135, filed Nov. 15, 2010.

U.S. Appl. No. 12/974,916, filed Dec. 21, 2010.

U.S. Appl. No. 12/974,822, filed Dec. 21, 2010.

U.S. Appl. No. 13/039,167, filed Mar. 2, 2011.

European Search Report Application No. EP 09290838.3 dated Feb. 16, 2010.

M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).

Ulicki, Bob et al., "De-Myth-tifying" the SOI Floating Body Effect, SOI Industry Consortium, pp. 2-7 (2009).

* cited by examiner

DRAM MEMORY CELL HAVING A VERTICAL BIPOLAR INJECTOR

FIELD OF THE INVENTION

The field of the invention is that of semiconductor devices, and more particularly that of memory cells formed by a field effect transistor FET with floating body, and memory cell arrays comprising a plurality of memory cells of this type.

BACKGROUND OF THE INVENTION

FIG. 1 shows a cross-section of a conventional floating body DRAM (dynamic random access memory) memory cell. The conventional floating body DRAM cell is formed in a silicon-on-insulator (SOI) substrate comprising a thin film of silicon 3 separated from the base substrate 1 by a buried oxide layer (BOX) 2. A floating body 4, a source region 5 and a drain region 6 are formed in the thin film 3 on top of the BOX 2. A gate dielectric layer 7 and a gate electrode 8 are sequentially deposited on top of the floating body 4. The drain region 6 is connected to a bit line BL, the source region 5 is connected to a source line SL and the gate electrode 8 is connected to a word line WL.

The floating body is electrically insulated by the BOX, the gate dielectric layer, the source region and the drain region. Because of this insulation, the floating body can store an electrical charge. In a data write operation in such a transistor, the floating body uses an impact ionization phenomenon to store charges, which modifies the threshold voltage of the transistor. In a data read operation, the quantity of the current flowing between the source and the drain of the transistor thus depends on the quantity of charges stored in the floating body.

In order to be able to perform a logic 1 state write operation (operation hereinafter called "write 1"), a relatively high voltage, of around 2.5 times the nominal power supply voltage VDD that has to be applied to the gate electrode, must be applied to the bit line BL. Besides the fact that this high voltage is likely to damage the cell, it can also disrupt the operation of nearby memory cells. The generation of this high voltage also requires dedicated circuitry implementing charge pumps.

One technique for reducing the surface area occupied by such a floating body DRAM memory cell is described in the document US 2004/0108532. This document proposes creating a memory cell by associating a floating body horizontal FET transistor and a horizontal bipolar transistor suitable for injecting charges into the floating body. The low storage capacity of the floating body is thus increased. The horizontal bipolar transistor is more specifically arranged laterally to the FET transistor with the emitter (serving as injector) of the bipolar transistor formed in the substrate with a conductivity opposite to the latter, the base of the bipolar transistor being formed by the substrate and the collector of the bipolar transistor serving as floating body for the FET transistor.

With such an arrangement, the surface area of the memory cell is reduced to approximately $10F^2$. However, in this arrangement, the emitter and the base consume surface area so that an even greater reduction of the memory cell surface area remains an objective to those skilled in the art.

Moreover, this memory cell has the drawback that it is difficult to accurately control the voltage of the substrate serving as base for the bipolar transistor. Since the injector is, moreover, shared between two adjacent memory cells, the result is a risk of disturbances between these neighbouring cells.

It will therefore be understood that the memory cell according to the document US 2004/0108532 is not totally satisfactory, and that there is still a need to remedy the above-mentioned drawbacks in the prior art.

SUMMARY OF THE INVENTION

The aim of the invention is to propose an improved memory cell that has a reduced surface area.

To this end, the invention proposes, according to a first aspect, a memory cell comprising an FET transistor having a source, a drain and a floating body between the source and the drain, and also an injector that can be controlled to inject a charge into the floating body of the FET transistor, the injector comprising a bipolar transistor having an emitter, a base and a collector, the latter being formed by the floating body of the FET transistor. Specifically, the memory cell is characterized by the fact that the emitter of the bipolar transistor is arranged so that the source of the FET transistor serves as the base for the bipolar transistor.

Some preferred, but nonlimiting, aspects of the memory cell of this first aspect are as follows. The FET transistor can be horizontal with the emitter being arranged so that the emitter/source assembly forms a vertical stack. The emitter can be connected to an injection line that runs below the surface of the cell. The emitter can be integrated in the source. The emitter can be arranged in a bottom region of the source. The source can comprise a strongly doped central region and a lightly doped peripheral region surrounding the central region with the emitter being arranged within the peripheral region of the source under the central region of the source. The emitter can be arranged in a top region of the source. The source can comprise a lightly doped top region and a strongly doped bottom region arranged below the top region with the emitter being integrated in the top region.

Some further preferred, but nonlimiting, aspects of the memory cell of this first aspect are as follows. The bottom region of the source can be arranged below a buried insulating layer and linked to the top region of the source via a connecting passage extending through the insulating layer. The emitter can be arranged below the source. The emitter can be arranged below a buried insulating layer and can be linked to the source via a connecting passage extending through the insulating layer. The FET transistor can also comprise a gate electrode recessed in the floating body and insulated from the latter by a dielectric layer. The emitter can comprise a doped semiconductive material of conductivity opposite to that of the source. The cell can be produced on a semiconductor-on-insulator substrate. The FET transistor can be formed in a well produced in the top part of a bulk substrate.

According to another aspect, the invention relates to a memory cell comprising a FET transistor having a source, a drain and a floating body between the source and the drain, and an injector that can be controlled to inject a charge into the floating body of the FET transistor, the injector comprising a bipolar transistor having an emitter, a base and a collector formed by the floating body of the FET transistor. Specifically, this memory cell being characterized in that the emitter is connected to an injection line that runs below the surface of the cell.

According to another aspect, the invention relates to a memory array comprising a plurality of memory cells according to one or more aspects of the invention. The memory array can notably comprise a source line coupled to the source of each memory cell along a column of the array and an injection line parallel to the source line coupled to the emitter of each memory cell along said column.

According to another aspect, the invention relates to a method of programming a memory cell comprising a horizontal FET transistor having a floating body, and an injector that can be controlled to inject a charge into the floating body of the FET transistor. Specifically, a logic 1 state is programmed by applying a nominal write voltage to the gate of the FET transistor, by applying a voltage less than or equal to the nominal write voltage to the drain of the FET transistor and by applying a positive voltage to the injector.

In a cell read operation, it is also possible to apply a fraction of the nominal write voltage to the gate of the FET transistor.

A first specific embodiment relates to a memory cell comprising a horizontal FET transistor having a source connected to a source line, a drain connected to a bit line and a floating body between the source and the drain; and an injector that can be controlled to inject a charge into the floating body of the FET transistor, the injector comprising a bipolar transistor having an emitter connected to an injection line, a base and a collector formed by the floating body of the FET transistor. In this cell, the emitter of the bipolar transistor is advantageously arranged so that the emitter/source assembly forms a vertical stack, the source of the FET transistor serving as the base for the bipolar transistor.

In this memory cell, the injection line typically runs below the surface of the memory cell with the emitter integrated in the source, arranged in a bottom region thereof. The source preferably comprises a strongly doped central region and a lightly doped peripheral region surrounding the central region, and the emitter is arranged within the peripheral region of the source under the central region of the source, and preferably in a top region of the source. Alternatively, the source comprises a lightly doped top region and a strongly doped bottom region arranged below the top region, and in which the emitter is integrated in the top region. In this embodiment, the bottom region of the source can be arranged below a buried insulating layer and be linked to the top region of the source via a connecting passage extending through the insulating layer.

The emitter is preferably arranged below the source. In particular, the emitter is arranged below a buried insulating layer and is linked to the source via a connecting passage extending through the insulating layer.

In the memory cell of the invention, the FET transistor may comprise a gate electrode recessed in the floating body and insulated from the latter by a dielectric layer. Advantageously, the FET transistor may be formed in a well produced in the top part of a bulk substrate. Also, the emitter may comprise a doped semiconductive material of conductivity opposite to that of the source. The memory cell can also include a buried insulating layer.

Another embodiment of the invention relates to a memory cell comprising a FET transistor having a source, a drain and a floating body between the source and the drain; and an injector that can be controlled to inject a charge into the floating body of the FET transistor, with the injector comprising a bipolar transistor having an emitter, a base and a collector formed by the floating body of the FET transistor. The emitter is typically connected to an injection line that runs below the surface of the memory cell.

The invention also relates to a memory array comprising a plurality of memory cells as disclosed herein. In one aspect, the array further comprises a source line coupled to the source of each memory cell along a column of the array and an injection line parallel to the source line coupled to the emitter of each memory cell along said column.

Various methods of controlling a memory cell are described herein. The memory cell can be controlled to program a logic 1 state by applying a positive voltage with a magnitude less than or equal to about the nominal power supply voltage to the drain of the FET transistor; applying a positive voltage to the injector; and applying about a nominal power supply voltage to the gate of the FET transistor. Alternatively, the memory cell can be controlled to program a logic 0 state by applying a negative voltage with a magnitude less than or equal to about the nominal power supply voltage to the drain of the FET transistor; and applying about a nominal power supply voltage to the gate of the FET transistor.

Further aspects and details and alternate combinations of the elements of this invention will be apparent from the following detailed description and are also within the scope of the inventor's invention.

BRIEF DESCRIPTION OF THE DRAWINGS

Other aspects, aims and advantages of the present invention will become more apparent from reading the following detailed description of preferred embodiments of the latter, given by way of nonlimiting examples and with reference to the appended drawings in which:

FIG. 2b represents a possible topology of a memory array employing memory cells of FIG. 2a;

FIG. 2c represents a circuit diagram equivalent to the memory cell of FIG. 2a;

DETAIL DESCRIPTION OF THE PREFERRED EMBODIMENTS

The preferred embodiments of the invention to be described do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description, and such modifications are also intended to fall within the scope of the appended claims.

Figure 2A:
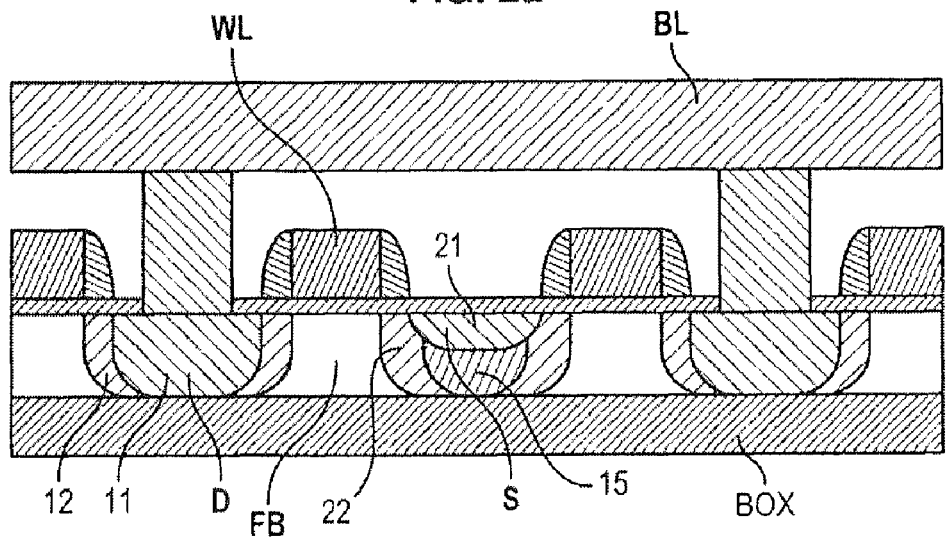
FIG. 2a represents a cross-sectional view of a memory cell according to one possible embodiment of the first aspect of the invention.

Referring now to FIG. 2a, a cross-sectional view of a memory cell according to a preferred embodiment of the first aspect of the invention is represented. This cell comprises an FET transistor having a source S, a drain D and a floating body FB between the source and the drain, and an injector that can be controlled to inject a charge into the floating body FB of the FET transistor.

The memory cell is, in this case, produced on a semiconductor-on-insulator SeOI substrate, preferentially a silicon-on-insulator SOI substrate. The drain D and the source S are preferentially in contact with the buried oxide layer BOX so that the FET transistor is fully depleted. The source S can thus be shared between two adjacent memory cells (along a line of a memory array extending in the plane of FIG. 2a; the columns of the memory array extending perpendicularly to the plane of FIG. 2a). Such sharing makes it possible to reduce the surface area occupied by a memory cell.

Figure 3A:
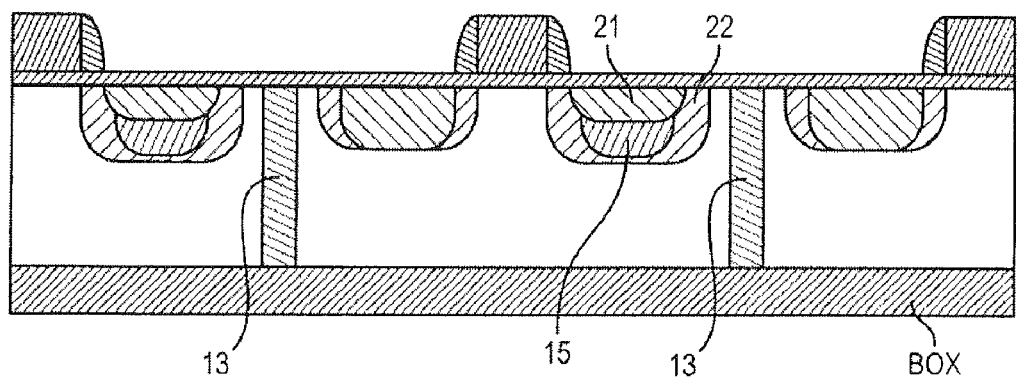
FIG. 3a represents a possible embodiment according to the invention of a memory cell using a partially depleted FET transistor on a semiconductor-on-insulator substrate.
Figure 3B:
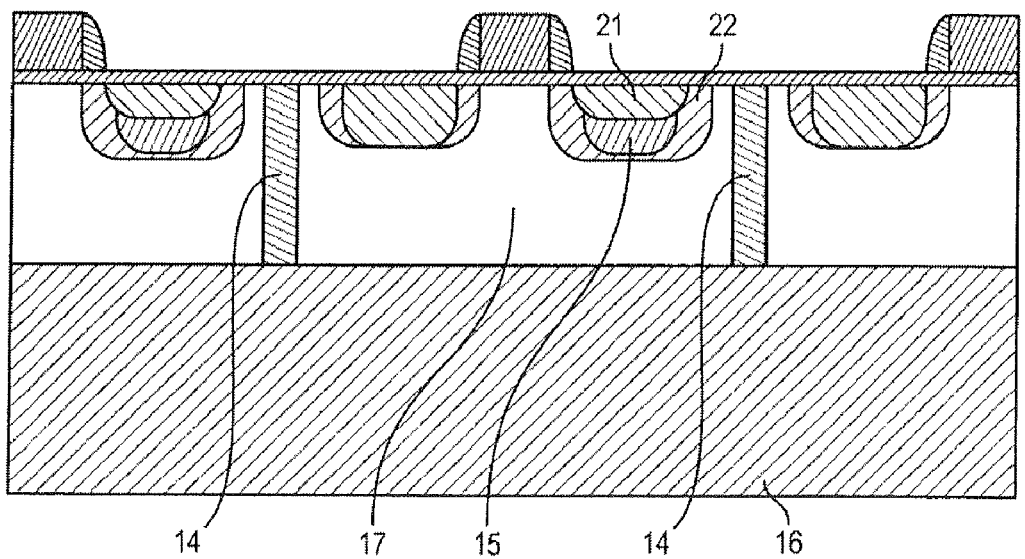
FIG. 3b represents a possible embodiment according to the invention of a memory cell using an FET transistor on a bulk substrate.

As can be seen in FIGS. 3a and 3b, the invention is not, however, limited to a fully depleted memory cell, but also extends to a memory cell on partially depleted Semiconductor-on-Insulator (SeOI) (FIG. 3a) and to a memory cell produced on a bulk substrate (FIG. 3b). In the case of these figures, and in a manner conventionally known, it is necessary to isolate the cells along a line of the memory array in order to create the floating body effect. In the case of FIG. 3a, this is conventionally done by lateral isolating trenches 13 (according to the shallow trench isolation STI technique) extending depthwise from the surface of the substrate to the BOX.

In the case of FIG. 3b, this is conventionally done by lateral isolating trenches 14 extending depthwise from the surface of the substrate, and by isolating the memory cell in a well 17 produced in the top part of the bulk substrate and delimited by the trenches 14. The FET transistor is situated in the semiconductive well 17, the conductivity of which is identical to that of the channel, which makes it possible to isolate it from the substrate. The well can also be arranged on a layer 16 of the substrate having an opposite conductivity.

Returning to the description of FIG. 2a, the injector consists of a bipolar transistor having an emitter 15, a base and a collector formed by the floating body FB of the FET transistor. In the context of the invention, the emitter 15 of the bipolar transistor is arranged so that the source S of the FET transistor serves as the base for the bipolar transistor. It will be noted that controlling the voltage of the source serving as the base for the bipolar transistor is easier than controlling the voltage of the substrate serving as the base for the bipolar transistor of the memory cell presented in the document US 2004/0108532.

The FET transistor is a horizontal transistor and the emitter of the bipolar transistor is more specifically arranged facing the source of the FET transistor so that the emitter/source assembly forms a vertical stack. In a preferred embodiment, the emitter is connected to an injection line that runs below the surface of the memory cell, thereby not consuming surface area.

The emitter 15 of the bipolar transistor can notably be integrated in the source of the FET transistor. According to a first variant embodiment represented in FIG. 2a, the emitter 15 is integrated in the source 21, 22 in a bottom region thereof.

Figure 3C:
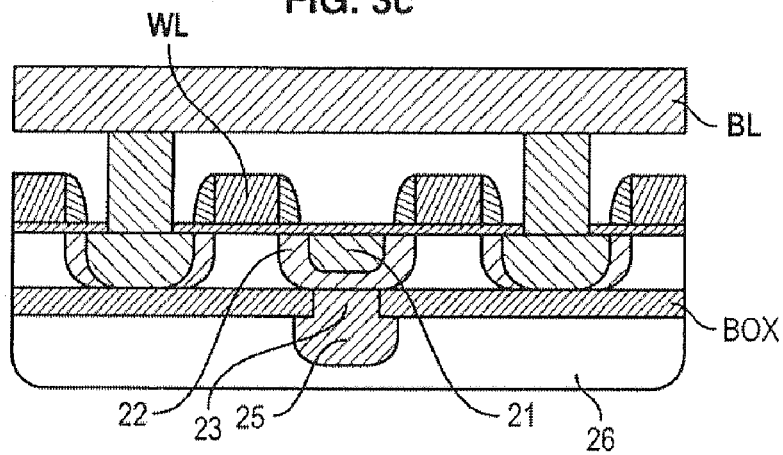
FIG. 3c represents another possible embodiment of a memory cell according to the invention in which the injection line is buried below the insulating layer.
Figure 3D:
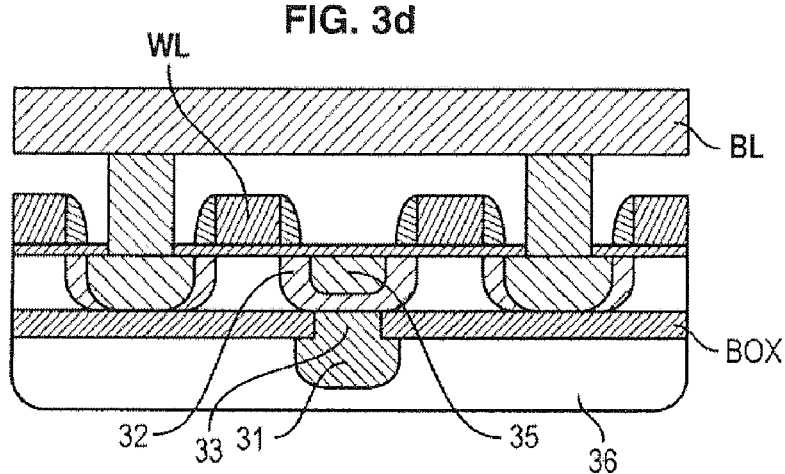
FIG. 3d represents another possible embodiment of a memory cell according to the invention in which the source line is buried below the insulating layer.

According to a second variant embodiment represented in FIG. 3d, the emitter 35 is integrated in the source 31, 32 in a top region thereof.

Still referring to FIG. 2a, the source conventionally comprises in a manner known per se a strongly doped central region 21 (for example N+) and a lightly doped peripheral region 22 (for example N−) surrounding the central region. The main purpose of the strongly doped central region 21 is to ensure the contact with the source line SL while the lightly doped peripheral region 22 mainly contributes to the operation of the FET transistor. Thus, it is the lightly doped region 22 which is used in the context of the invention as the base for the bipolar transistor.

In the context of this variant, the emitter 15 is arranged so as to be positioned below the central region 21 of the source while being in contact with the peripheral region 22 of the source and isolated from the floating body FB by the peripheral 22 of the source. The emitter is, in this case, totally integrated in the source electrode between the central 21 and peripheral 22 regions thereof.

In the case of a memory cell made of fully depleted SeOI (see FIG. 2a), and unlike the case of a memory cell made of partially depleted SeOI (FIG. 3a) or a memory cell on bulk substrate (FIG. 3b), the BOX can help to insulate the emitter 15 from the floating body. It will be noted that the drain D can also have a strongly doped central region 11 (N+ in the example) and a lightly doped peripheral region 12 (N− in the example) surrounding the central region.

In a manner known conventionally, the drain D is linked to a bit line BL. This bit line BL can extend along a line of the memory array, coming into contact with the drain of each of the memory cells arranged along this line.

Figure 2B:
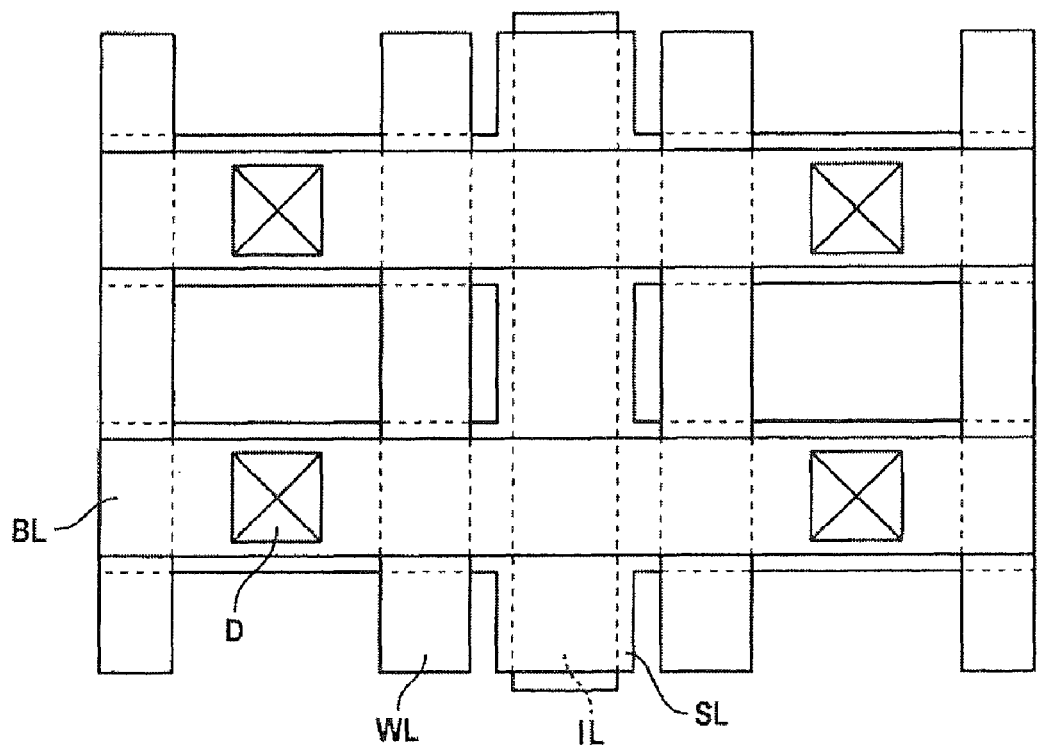

As can be seen in FIG. 2b, the source S is connected to a source line SL. This source line SL typically extends perpendicularly to the bit line BL, coming into contact with the source (typically the strongly doped region of the source) of each of the memory cells arranged along a column of the memory array.

In the case of FIGS. 2a and 2b, the source line SL therefore runs immediately below the surface of the SeOI substrate. Moreover, in the case of these FIGS. 2a and 2b in which the source is shared between two adjacent cells, a single source line SL can be used to address the source of the two memory cells. The emitter 15 is linked to an injection line IL which extends parallel to the source line SL so as to address the memory cells arranged along a column of the memory array.

It will be understood from the foregoing that, in the case of FIG. 2a, the injection line IL is arranged below the source line SL. The result of this is a particularly compact arrangement inasmuch as the injection line IL does not consume any surface region.

FIG. 2b represents a topology of a memory array according to the invention with the source line SL shared between two adjacent cells. This arrangement is thus even more compact. Based on the topology of FIG. 2b, the surface area of the memory cell can thus be reduced to approximately 4 $F^2$ in the case where a standalone memory is being developed. While this cell is not totally insensitive to disturbances, nevertheless the level of disturbances remains low and in any case less than the level of disturbance encountered with conventional memory cells.

In the case of an embedded memory, given that the requirements are greater for the transistors (need to provide spacers to avoid cross-excitation phenomena), the surface area occupied by the transistors is greater. A memory cell surface area of the order of 15 F² to 18 F² is then achieved. It does, however, offer the benefit of being totally insensitive to the disturbances.

Figure 8:
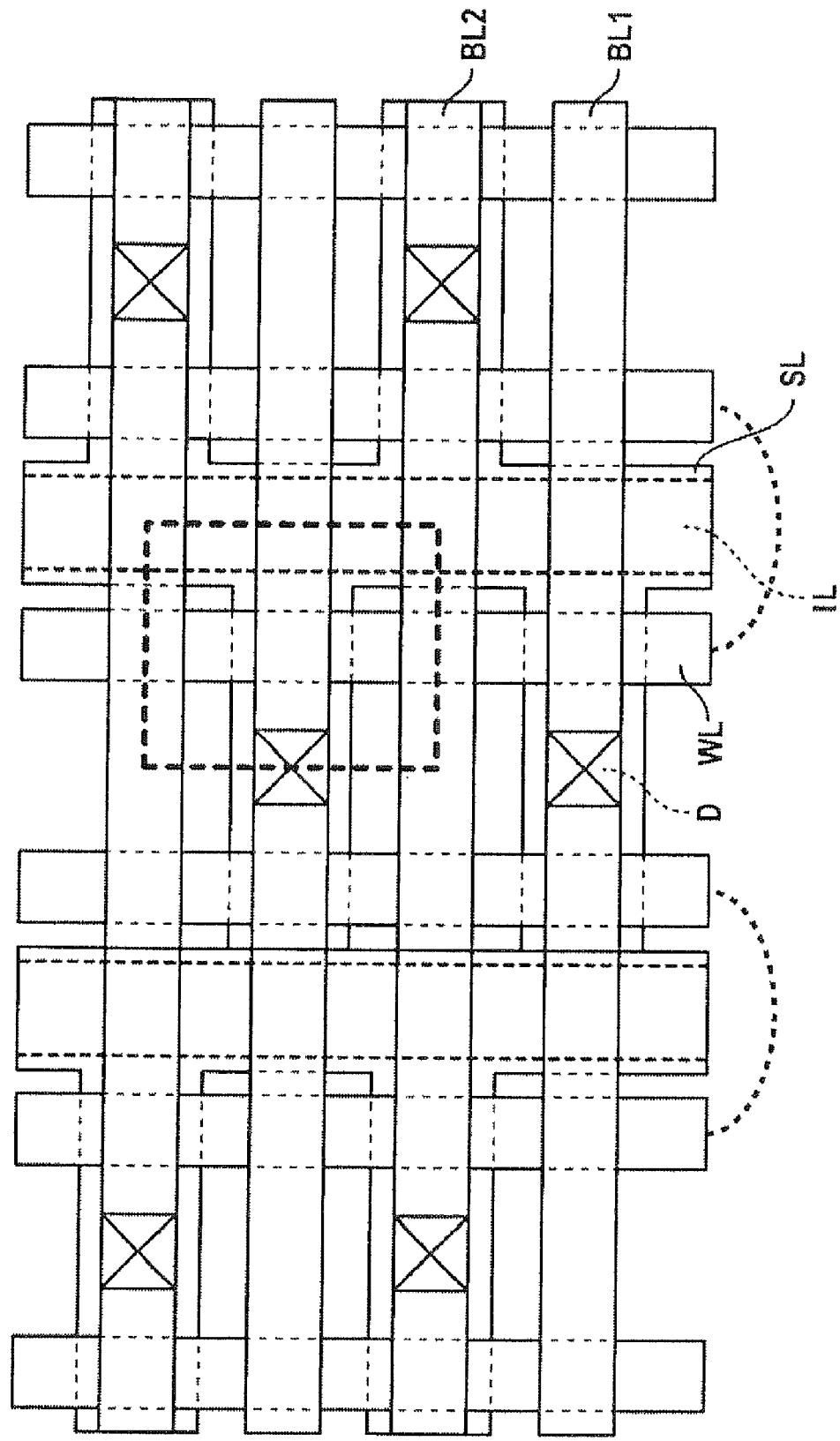
FIG. 8 represents another possible topology of a memory array employing memory cells according to the invention.

Another possible topology, less compact but totally insensitive to disturbances, is represented in FIG. 8. In this topology, the word line WL controls two adjacent physical rows which share a common source line SL. This particular arrangement eliminates most of the sources of mutual disturbances since the cells situated on this double word line WL are all used and it can be legitimately assumed that the write circuits are more powerful than the disturbances. On the other hand, the two cells situated one on top of the other must, imperatively, be connected to two different bit lines BL1, BL2, otherwise their information would become mixed during the WL access. This has a direct impact on the surface area of the cell since it must be wide enough to leave two lines of metal alongside one another. While the latter point is generally prohibitive for standalone memories, it is, on the other hand, perfectly legitimate in the case of embedded memories inasmuch as the surface area of the cell is around 4F*4F=16 F².

As is represented in FIG. 2a, the FET transistor also has a gate electrode positioned above the floating body, on the surface of the memory array, and insulated from the floating body by a dielectric layer. The gate electrode is linked to a word line WL which typically extends along a column of the memory array.

According to another embodiment not represented, the gate electrode is recessed in the floating body and insulated therefrom by a dielectric layer. An RCAT (recessed channel array transistor) type transistor is thus defined.

Figure 2C:
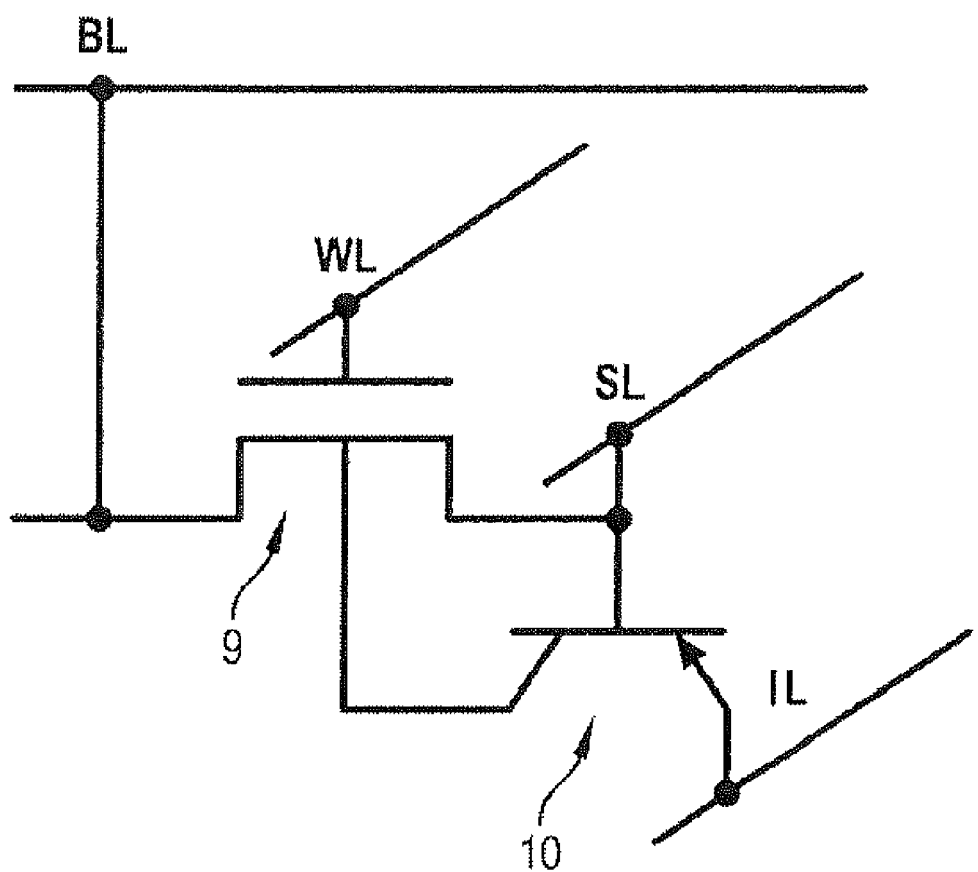

FIG. 2c is a circuit diagram equivalent to the memory cell according to the first aspect of the invention. In this figure, the FET transistor—in this case N—has the reference 9 and the bipolar transistor—in this case PNP—has the reference 10. As previously discussed, the source of the FET transistor 9 connected to the source line SL serves as the base for the bipolar transistor 10, while the body of the FET transistor 9 serves as the collector for the bipolar transistor 10.

Referring to FIG. 3d illustrating another variant embodiment, the emitter 35 is integrated in the source 31, 32 in a top region thereof. In the context of this variant, the source S comprises a lightly doped top region 32 and a strongly doped bottom region 31 arranged below the top region, the emitter 35 being integrated in the top region 32. As represented in this FIG. 3d, the bottom region 31 of the source can in particular be arranged below a buried insulating layer in the substrate, for example the BOX layer in the case of an SeOI substrate, while being linked to the top region 32 of the source via a connecting passage 33 extending through the insulating layer. The strongly doped bottom region 31 of the source (N+ doping in the example concerned) is more specifically arranged, below the insulating layer, in a region 36 of the substrate that has an opposite conductivity (P− region in the example).

In the context of this variant, the source line SL is buried; it can notably be buried directly below the insulating layer BOX as represented in FIG. 3d. The emitter 35 of the bipolar transistor is linked to an injection line IL which extends directly below the surface of the substrate (this injection line IL is provided instead of the source line of a conventional cell) and which, because of this, is easier to access. Also in this variant, the vertical stack of the source and the emitter has the particular consequence that the injection line consumes no surface area.

Figure 3E:
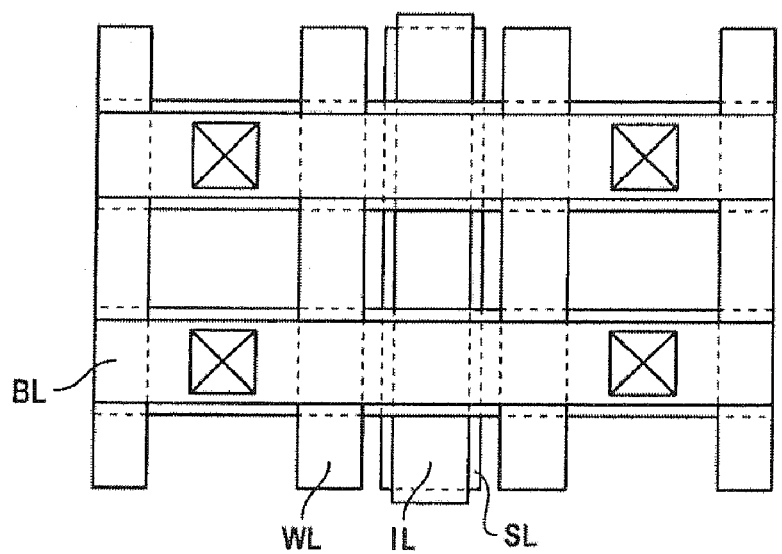
FIG. 3e represents a possible topology of a memory array employing memory cells of FIG. 3d.

FIG. 3e represents a possible topology of a memory array employing memory cells of FIG. 3d. In this topology, the source line SL extends parallel to the injection line IL along a column of the memory array, while being buried below the injection line, under the BOX layer. In this variant embodiment, the injection line IL is simpler to access.

FIG. 3c represents another possible embodiment, in which the vertical stack of the source and the emitter is obtained by arranging the emitter 25 below the source 21, 22. It will be noted that this embodiment corresponds to the variant of FIG. 3d with the emitter and the strongly doped region of the source simply interchanged. In practice, in this other embodiment, the emitter 25 (P+) is buried under the insulating layer, in a region 26 of the substrate that has an opposite conductivity (N− in the example) and is linked to the peripheral region 22 of the source via a connecting passage 23 extending through the insulating layer.

The source line SL conventionally extends immediately below the surface of the substrate, while the injection line IL extends under the BOX layer parallel to the source line SL. Thus, the injection line IL does not consume any surface area.

The injection line is preferentially produced using a doped semiconductive material. This is a P-type doping (notably, a P+ doping) of the material of the substrate in the examples represented in the figures in which the FET transistor is of the N type (P-type floating body). It will be understood that the invention is not limited to an N FET transistor, but also extends to the case of a P FET transistor (N-type floating body).

By using the techniques conventionally used in CMOS technology to produce such a doping of the substrate in order to produce the injection line IL, the latter does not need to be metallized so that metal wiring can be avoided.

Figure 1:
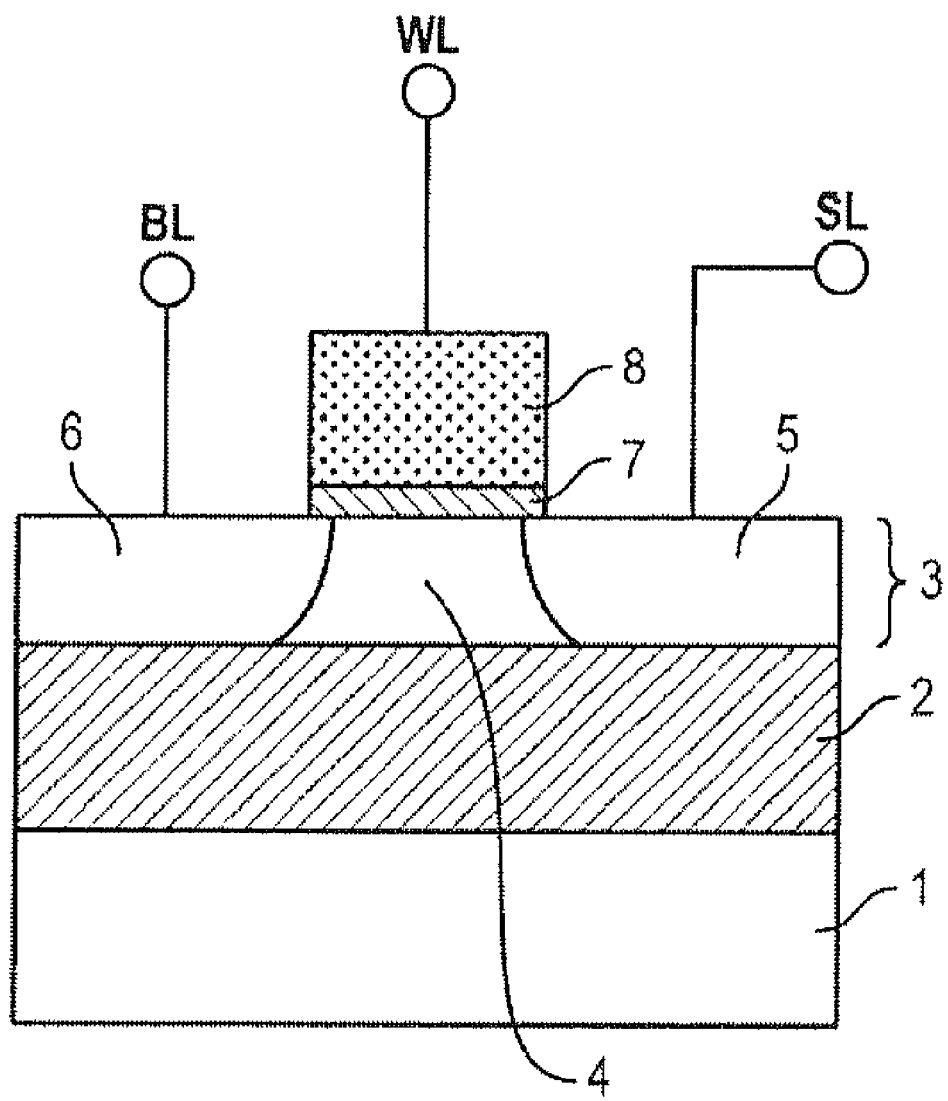
FIG. 1 represents a conventional floating body DRAM cell.

FIGS. 4a-4b, 5a-5b, 6a-6b and 7a-7b show the equivalent circuit diagram of FIG. 2a in order to compare the different programming, read and hold operations for a conventional memory cell of the type of that illustrated in FIG. 1 (FIGS. 4a, 5a, 6a and 7a) and for a memory cell according to the invention (FIGS. 4b, 5b, 6b and 7b).

Figure 4A:
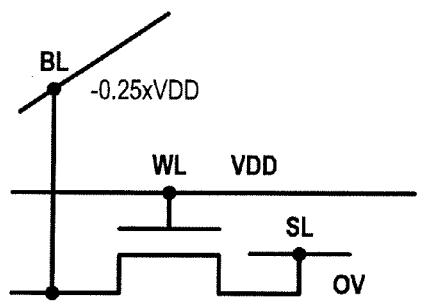
FIGS. 4a and 4b respectively represent programming a logic 0 state in a conventional DRAM cell and in a DRAM cell according to the invention.
Figure 4B:
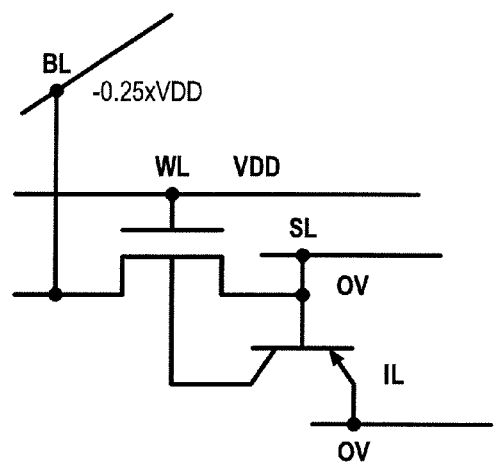
Figure 5A:
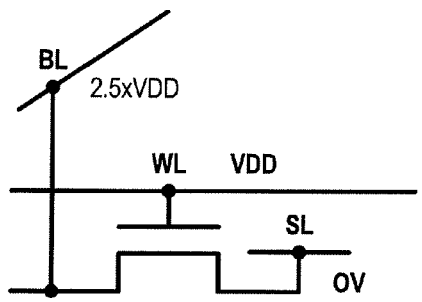
FIGS. 5a and 5b respectively represent programming a logic 1 state in a conventional DRAM cell and in a DRAM cell according to the invention.
Figure 5B:
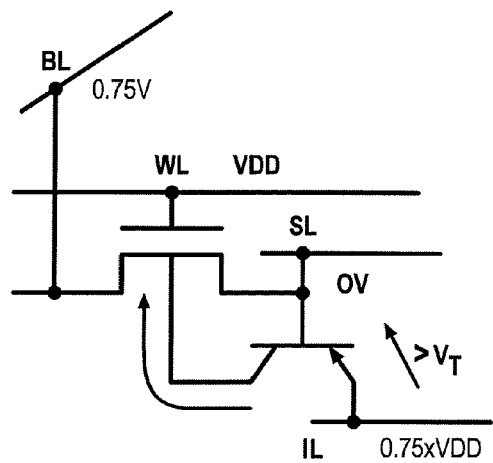
Figure 6A:
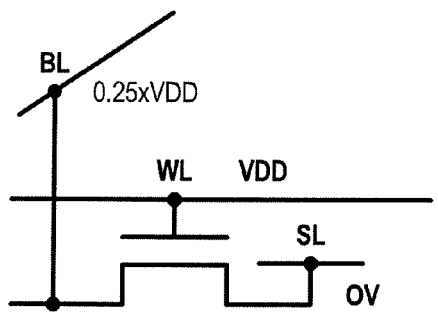
FIGS. 6a and 6b respectively represent reading the logic state stored by a conventional DRAM cell and by a DRAM cell according to the invention.
Figure 6B:
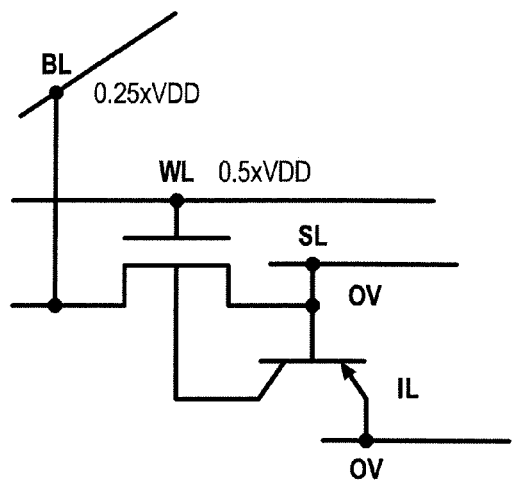
Figure 7A:
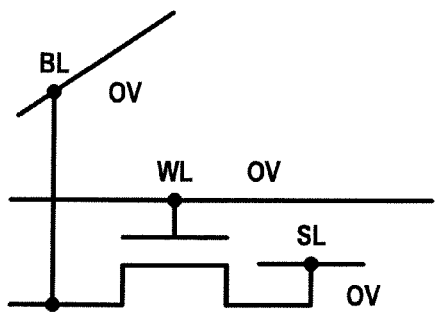
FIGS. 7a and 7b respectively represent holding the logic state stored in a conventional DRAM cell and in a DRAM cell according to the invention.
Figure 7B:
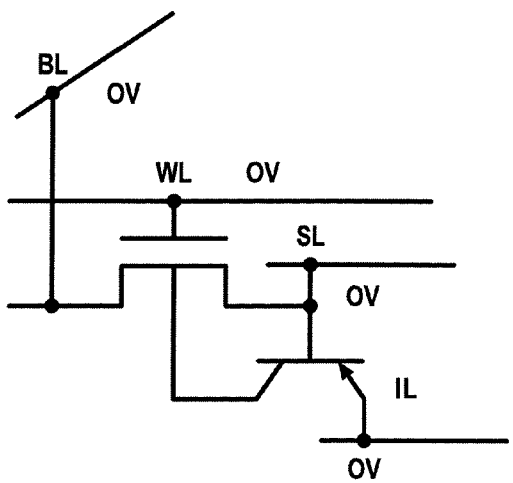

In these various figures:

FIGS. 4a and 4b illustrate the WRITE 0 operation for programming the logic 0 state, FIGS. 5a and 5b illustrate the WRITE 1 operation for programming the logic 1 state, FIGS. 6a and 6b illustrate the READ operation for reading the logic state, FIGS. 7a and 7b illustrate the HOLD operation for holding the logic state.

The tables below illustrate examples of voltages that have to be applied to the various lines to control the cell and carry out these various operations.

TABLE 1

Memory cell of FIG. 1 (prior art)

| abbrev. | name of connection | connected to |
|---|---|---|
| BL | bit line | drain of FET |
| WL | word line | gate of FET |
| SL | source line | source of FET |
| IL | injection line | emitter of bipolar |
|  | body of FET | collector of bipolar |
|  | source of FET | base of bipolar | nominal voltage - VDD supply voltage

|  | BL drain of FET | WL gate of FET | SL source of FET |
|---|---|---|---|
| WRITE 1 | 2.5 VDD | VDD | 0 V |
| WRITE 0 | −0.25 VDD | VDD | 0 V |
| READ | 0.25 VDD | VDD | 0 V |

TABLE 1-continued

Memory cell of FIG. 1 (prior art)

| | | | |
|---|---|---|---|
| HOLD | 0 V | 0 V | 0 V |

TABLE 2

Memory cell according to the invention

| | BL<br>drain of FET | WL<br>gate of FET | SL<br>source of FET | IL<br>emitter<br>of bipolar |
|---|---|---|---|---|
| WRITE 1 | 0.75 VDD | VDD | 0 V | 0.75 VDD |
| WRITE 0 | −0.25 VDD | VDD | 0 V | 0 V |
| READ | 0.25 VDD | 0.5 VDD | 0 V | 0 V |
| HOLD | 0 V | 0 V | 0 V | 0 V |

It will first of all be observed that the voltage that has to be applied to the word line WL to carry out the read operation READ is, moreover, lowered to a fraction of the nominal power supply voltage VDD, for example about 0.5 VDD. This makes it possible to lower the overall consumption level of the cell. Furthermore, inasmuch as this voltage is situated between the two threshold voltage levels ("0" and "1"), the read selection leads to the presence of a current for the lowest threshold voltage (in principle, "0" by convention), and the absence of current in the other case. The design of the detection amplifier is then reduced to a "simple" comparator that is much easier to design than if there are two currents of different amplitudes that must be compared to references, references that must be known and that must be trusted.

Moreover, as already described in the introduction, a voltage of around 2.5 times the nominal write voltage VDD must be applied to the drain of the conventional memory cell to carry out the WRITE 1 operation.

By using the injection of charge into the floating body by the injector, the invention makes it possible to lower the voltage needed to carry out this WRITE 1 operation. In particular, the voltage that has to be applied to the drain of a memory cell according to the invention is less than or equal to the nominal voltage VDD, for example about 0.75 VDD as indicated in Table 2 above The fact that all the programming operations are carried out with low voltages applied to all the power supply lines 1 offers a number of advantages. First of all, the power consumption is reduced and the design of the peripheral circuits is simplified. In particular, the circuitry needed to generate high voltages (2.5 VDD for the conventional memory cell, notably for the WRITE 1 operation) is not necessary.

Moreover, by reducing the voltage, damage to the memory cell is avoided. Disturbance of the neighbouring cells is also avoided. Thus, a disturbance potentially generated via the bit line BL in a write operation on a neighbouring cell corresponds to a voltage of 0.75 VDD (WRITE 1) or −0.25 VDD (WRITE 0) on the bit line BL in the example in question (with WL=SL=IL=0V). These relatively low voltages are not likely to generate significant disturbances.

A disturbance potentially generated via the word line WL in a WRITE 1 write operation on a neighbouring cell corresponds to respective voltages of VDD on the word line WL and of 0.75 VDD on the injection line IL (and with BL=SL=0V). An injection of charge (holes in the example described here) into the floating body via the bipolar transistor is then likely to occur.

In a WRITE 0 write operation on a neighbouring cell, WL is at VDD while BL=SL=IL=0V. The bipolar transistor (PNP type in the example described here) is then OFF and all the holes are likely to be evacuated via at negative bit line.

In order to simply overcome these disturbance phenomena, a choice can be made to not remain passive by writing to the stressed cells given that they are located on the active word line WL (which is tantamount to carrying out valid WRITE operations on all the cells along WL by applying the appropriate voltages to all the corresponding bit lines). This conditions the partitioning of the memory (requires all the cells along the word line WL to belong to the same word) without, however, this posing any problem given that all the stressed cells can be used directly by the application. In practice, if the word is wider, the information bit rate is greater and ultimately the consumption is lower.

In general and unless specifically stated to the contrary elsewhere, the following approximate voltages and voltage ranges are preferred. Preferred READ voltages on BL can be any voltage in the range about 0.1-0.4 VDD, ex., about 0.1 VDD, or about 0.2 VDD, or about 0.25 VDD, or about 0.3 VDD, or about 0.4 VDD. Preferred READ voltages on WL can be any voltage in the range about 0.3-0.7 VDD, ex., about 0.3 VDD, or about 0.4 VDD, or about 0.5 VDD, or about 0.6 VDD, or about 0.7 VDD. Preferred WRITE 1 voltages on BL and IL can be any voltage in the range about 0.6-0.9 VDD, ex., 0.6 VDD, or about 0.7 VDD, or about 0.75 VDD, or about 0.8 VDD, or about 0.9 VDD. Preferred WRITE 0 voltages on BL can be any voltage in the range about −0.4 to −0.1 VDD, ex., about −0.4 VDD, or about −0.3 VDD, or about −0.25 VDD, or about −0.2 VDD, or about −0.1 VDD. Preferred WRITE 1 or WRITE 0 voltages on WL can be about 1.0 VDD (alternatively, preferred read voltages on BL being any voltage in the range about 0.8-1.0 VDD, ex., about 0.8 VDD, or about 0.9 VDD, or about 1.0 VDD. Further, in cases where a preferred voltage is 0.0 VDD, preferred voltages can be any voltage in the range about −0.2-0.2 VDD, ex., about −0.2 VDD, or about −0.1 VDD, or about 0.0 VDD, or about 0.1 VDD, or about 0.2 VDD.

It will have been understood from the foregoing that the invention is not limited to a memory cell according to its first aspect, but also extends to a memory array comprising a plurality of memory cells according to the first aspect of the invention, and to a method of controlling such a memory cell.

The words "significant" and "likely" (and similar words of degree) are used here to mean within acceptable and expected limits for the intended use, usually but not exclusively commercial uses. For example, in the phrase "significant disturbances", disturbances to memory cell operation are considered significant if, ex., they are greater the level of disturbance encountered with conventional, commercially-acceptable memory cells in conventional applications. Similarly the phrase "not likely to generate significant disturbances" is considered to mean that such "significant disturbances" occur less than 25%, or less than 5%, or less than 1%, or less than 0.2%, or less than 0.1%, if the time. It should be understood that this invention is not limited to commercial uses; intended uses include research uses, special purpose uses, and so forth, and that "significant" is judged in the context of these other uses.

What is claimed is:

1. A memory cell comprising:
    a horizontal FET transistor having a source connected to a source line, a drain connected to a bit line and a floating body between the source and the drain; and
    an injector that can be controlled to inject a charge into the floating body of the FET transistor, the injector comprising a bipolar transistor having an emitter connected to an injection line, a base and a collector formed by the floating body of the FET transistor, with the injection line running below the surface of the memory cell;

wherein the emitter of the bipolar transistor is arranged so that the emitter/source assembly forms a vertical stack, the source of the FET transistor serving as the base for the bipolar transistor.

2. The memory cell of claim 1, in which the emitter is integrated in the source.

3. A memory cell comprising:
a horizontal FET transistor having a source connected to a source line, a drain connected to a bit line and a floating body between the source and the drain; and
an injector that can be controlled to inject a charge into the floating body of the FET transistor, the injector comprising a bipolar transistor having an emitter connected to an injection line, a base and a collector formed by the floating body of the FET transistor;
wherein the emitter of the bipolar transistor is arranged in a bottom region of the source so that the emitter/source assembly forms a vertical stack, the source of the FET transistor serving as the base for the bipolar transistor.

4. The memory cell of claim 3, in which the source comprises a strongly doped central region and a lightly doped peripheral region surrounding the central region, and in which the emitter is arranged within the peripheral region of the source under the central region of the source.

5. The memory cell of claim 2, in which the emitter is arranged in a top region of the source.

6. A memory cell comprising:
a horizontal FET transistor having a source connected to a source line, a drain connected to a bit line and a floating body between the source and the drain; and
an injector that can be controlled to inject a charge into the floating body of the FET transistor, the injector comprising a bipolar transistor having an emitter connected to an injection line, a base and a collector formed by the floating body of the FET transistor;
wherein the emitter of the bipolar transistor is arranged in a top region of the source so that the emitter/source assembly forms a vertical stack, the source of the FET transistor serving as the base for the bipolar transistor, and
wherein the source comprises a lightly doped top region and a strongly doped bottom region arranged below the top region, and in which the emitter is integrated in the top region.

7. The memory cell of claim 6, in which the bottom region of the source is arranged below a buried insulating layer and is linked to the top region of the source via a connecting passage extending through the insulating layer.

8. The memory cell of claim 1, in which the emitter is arranged below the source.

9. A memory cell comprising:
a horizontal FET transistor having a source connected to a source line, a drain connected to a bit line and a floating body between the source and the drain; and
an injector that can be controlled to inject a charge into the floating body of the FET transistor, the injector comprising a bipolar transistor having an emitter connected to an injection line, a base and a collector formed by the floating body of the FET transistor;
wherein the emitter of the bipolar transistor is arranged below a buried insulating layer and is linked to the source via a connecting passage extending through the insulating layer so that the emitter/source assembly forms a vertical stack, the source of the FET transistor serving as the base for the bipolar transistor.

10. The memory cell of claim 1, in which the FET transistor also comprises a gate electrode recessed in the floating body and insulated from the latter by a dielectric layer.

11. The memory cell of claim 1, in which the emitter comprises a doped semiconductive material of conductivity opposite to that of the source.

12. The memory cell of claim 1, further comprising a buried insulating layer.

13. The memory cell of claim 1, in which the FET transistor is formed in a well produced in the top part of a bulk substrate.

14. A memory cell comprising:
a FET transistor having a source, a drain and a floating body between the source and the drain; and
an injector that can be controlled to inject a charge into the floating body of the FET transistor, the injector comprising a bipolar transistor having an emitter, a base and a collector formed by the floating body of the FET transistor,
wherein the emitter is connected to an injection line that runs below the surface of the memory cell.

15. A memory array comprising a plurality of memory cells according claim 1.

16. A memory array according to claim 15 further comprising a source line coupled to the source of each memory cell along a column of the array and an injection line parallel to the source line coupled to the emitter of each memory cell along said column.

17. A memory array comprising a plurality of memory cells according claim 14.

18. A method of controlling a memory cell of claim 1 to program a logic 1 state comprising:
applying a positive voltage with a magnitude less than or equal to about the nominal power supply voltage to the drain of the FET transistor;
applying a positive voltage to the injector; and
applying about a nominal power supply voltage to the gate of the FET transistor.

19. A method of controlling a memory cell of claim 1 to program a logic 0 state comprising:
applying a negative voltage with a magnitude less than or equal to about the nominal power supply voltage to the drain of the FET transistor; and
applying about a nominal power supply voltage to the gate of the FET transistor.

20. A memory array comprising a plurality of memory cells according claim 9.

* * * * *